(12) United States Patent
Oraw et al.

(10) Patent No.: US 9,508,694 B2
(45) Date of Patent: Nov. 29, 2016

(54) MULTI-LAYER CONDUCTIVE BACKPLANE FOR LED LIGHT SHEET SEGMENTS

(71) Applicant: Nthdegree Technologies Worldwide Inc., Tempe, AZ (US)

(72) Inventors: Bradley Steven Oraw, Chandler, AZ (US); Bemly Sujeewa Randeniya, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 23 days.

(21) Appl. No.: 14/559,609

(22) Filed: Dec. 3, 2014

(65) Prior Publication Data

US 2015/0255438 A1 Sep. 10, 2015

Related U.S. Application Data

(60) Provisional application No. 61/947,573, filed on Mar. 4, 2014.

(51) Int. Cl.
| | |
|---|---|
| *H01L 33/62* | (2010.01) |
| *H01L 25/075* | (2006.01) |
| *H05K 1/00* | (2006.01) |
| *H01L 33/42* | (2010.01) |

(52) U.S. Cl.
CPC ............. *H01L 25/0753* (2013.01); *H05K 1/00* (2013.01); *H01L 33/42* (2013.01); *H01L 33/62* (2013.01); *H01L 2924/0002* (2013.01)

(58) Field of Classification Search
CPC ............. H01L 25/075; H01L 25/0753; H01L 25/0756; H01L 27/156; H01L 21/0508; H01L 33/62; H01L 24/17; H01L 33/486; H01L 33/405
See application file for complete search history.

(56) References Cited

U.S. PATENT DOCUMENTS

| | | | |
|---|---|---|---|
| 2007/0090387 A1* | 4/2007 | Daniels | H01L 24/75 257/99 |
| 2008/0080200 A1* | 4/2008 | Robbins | B60Q 1/2696 362/487 |
| 2013/0026504 A1* | 1/2013 | Marx | F21K 9/00 257/88 |
| 2014/0209936 A1* | 7/2014 | Oraw | H01L 25/0756 257/88 |
| 2014/0209945 A1* | 7/2014 | Baldridge | H01L 25/0753 257/91 |
| 2014/0231834 A1* | 8/2014 | Lowenthal | H01L 25/0753 257/88 |
| 2015/0129899 A1* | 5/2015 | Speer | H01L 27/15 257/88 |
| 2015/0221682 A1* | 8/2015 | Voutsas | H01L 27/1255 257/71 |

* cited by examiner

*Primary Examiner* — Fazli Erdem
(74) *Attorney, Agent, or Firm* — Patent Law Group LLP; Brian D. Ogonowsky

(57) ABSTRACT

Relatively small, electrically isolated segments of LED light sheets are fabricated having an anode terminal and a cathode terminal. The segments contain microscopic printed LEDs that are connected in parallel by two conductive layers sandwiching the LEDs. The top conductive layer is transparent. Separately formed from the light sheet segments is a flexible, large area conductor backplane having a single layer or multiple layers of solid metal strips (traces). The segments are laminated over the backplane's metal pattern to supply power to the segment terminals. An adhesive layer secures the segments to the backplane. The metal pattern may connect the segments in series, or parallel, or form an addressable circuit for a display. The segments may be on a common substrate or physically separated from each other prior to the lamination.

20 Claims, 8 Drawing Sheets

MULTI-LAYER CONDUCTIVE BACKPLANE FOR LED LIGHT SHEET SEGMENTS

CROSS-REFERENCE TO RELATED APPLICATIONS

This application is based on U.S. provisional application Ser. No. 61/947,573, filed Mar. 4, 2014, by Bradley S. Oraw et al., assigned to the present assignee and incorporated herein by reference.

FIELD OF THE INVENTION

This invention relates to light sheets formed using distributed light emitting diodes (LEDs) and, in particular, to a technique of interconnecting segmented areas of the LEDs.

BACKGROUND

The present assignee has developed a printable LED light sheet where microscopic inorganic LED chips, having a top electrode and a bottom electrode, are printed as an ink on a conductive layer on a thin substrate. Such LEDs are called vertical LEDs. After the ink is cured, the bottom electrodes of the LEDs make electrical contact to the conductive layer. A dielectric layer is then deposited between the LEDs, and another conductive layer is printed to make electrical contact to the top electrodes of the LEDs to connect the LEDs in parallel. A suitable voltage is applied to the two conductive layers to illuminate the LEDs. To allow light to escape, one or both of the conductive layers is transparent. Indium tin oxide (ITO) or sintered silver nano-wires are preferred for the transparent conductive layer. With nano-wires, after the nano-wire ink is printed and cured, the nano-wires form a sintered mesh with spaces between the nano-wires to allow the light to pass.

One desired application of the light sheet technology is for large area lamps, such a 2×4 foot lamp to replace conventional fluorescent troffers. Other large area applications are envisioned.

The practical sheet resistance of the printed ITO layer is typically 50-100 Ohms/square and, for silver nano-wires, it is typically about 5-10 Ohm/square. For large light sheets, the currents conducted by the conductive layers are large so there will be significant voltage drops across the light sheet resulting in brightness non-uniformity. Thicker layers of the transparent conductor can lower the resistance, but this limits transparency, makes it more difficult to fabricate, reduces flexibility, and adds cost. As a result, the transparent conductive layer can only be optimized for a relatively small LED light sheet, limiting the practicality of using the technology for large area light sheets.

What is needed is a technique for forming a larger area LED light sheet of any size that does not suffer from the above-described problems with the transparent conductive layer. Further, the technique should allow the lamp to be formed using a roll-to-roll process.

SUMMARY

Relatively small segments of identical LED light sheets are fabricated having an anode terminal and a cathode terminal. A single segment can range from a few square centimeters to up to 25 cm² or more. Each segment will typically contain at least 5 LEDs and possibly hundreds of LEDs, depending on the desired size and brightness of each segment. The anode terminal may be along one edge of the light sheet segment, and the cathode terminal may be along the opposite edge. The terminals may be on the side of the light sheet segment that is opposite to the light emission side. The microscopic LEDs printed in each segment are connected in parallel by two conductive layers sandwiching the vertical LEDs. At least one of the conductive layers is transparent and formed of an ITO layer, a silver nano-wire mesh, or another type of transparent conductor. Such transparent conductive layers have a sheet resistance that is much higher than a solid metal layer, such as an aluminum or copper layer, but are made thin to optimize transparency and flexibility. One of the conductive layers terminates with the anode terminal and the other of the conductive layers terminates with the cathode terminal. The terminals may be more robust metal layers that have been printed on the light sheet segment.

Since the segments are small, there is not much current carried by the conductive layers so the conductive layers may be thin without a significant voltage drop across the segment. Therefore, there is good brightness uniformity across each segment.

The segments are very flexible and may be less than 100 microns thick.

Separately formed from the light sheet segments is a flexible, larger area conductor backplane having a single layer or multiple layers of solid metal strips (traces) that interconnect the segments and connect them to power supply terminals. The metal strips have very low resistance and can carry large currents without any significant voltage drop. The metal strips have raised bumps that contact the anode and cathode terminals of the light sheet segments when the segments are mounted over the backplane, such as during a roll-to-roll lamination process.

An adhesively layer covers the top surface of the backplane, and the raised bumps extend above the adhesive layer.

The light sheet segments are aligned with the backplane and pressed in position over the backplane to adhesively secure the segments to the backplane and make the various electrical interconnections between the metal bumps and the segment terminals. The adhesive may be flexible after curing. The arrangement of the metal strips on the backplane and the raised bumps determine how the segments will be electrically connected. Some connection possibilities include: segments in parallel, segments in series, addressable segments for brightness control, and addressable columns and rows of segments for a display. For a practical display, the segments may be about a square centimeter or any larger size. A practical minimum size for a square segment is about 4 mm². For column and row metal strips, the backplane contains multiple layers of metal strips that are insulated from one another by a thin dielectric layer. The pitch of the metal strips can be less than 1 mm. In one embodiment, the backplane supports a single linear array of segments connected in series and/or parallel to form a narrow light strip of any length. In another embodiment, the backplane supports a two-dimensional array of segments to replace a 2×4 foot fluorescent troffer.

In another embodiment, the segments are not physically separated from each other but are printed on a single large substrate (e.g., a plastic film) and electrically isolated from one another. Using this technique, the handling of the segments and alignment of the segments (being a single unit) relative to the backplane are simplified.

Other embodiments are described.

BRIEF DESCRIPTION OF THE DRAWINGS

Elements that are similar or identical in the various figures are labeled with the same numeral.

DETAILED DESCRIPTION

Figure 1:
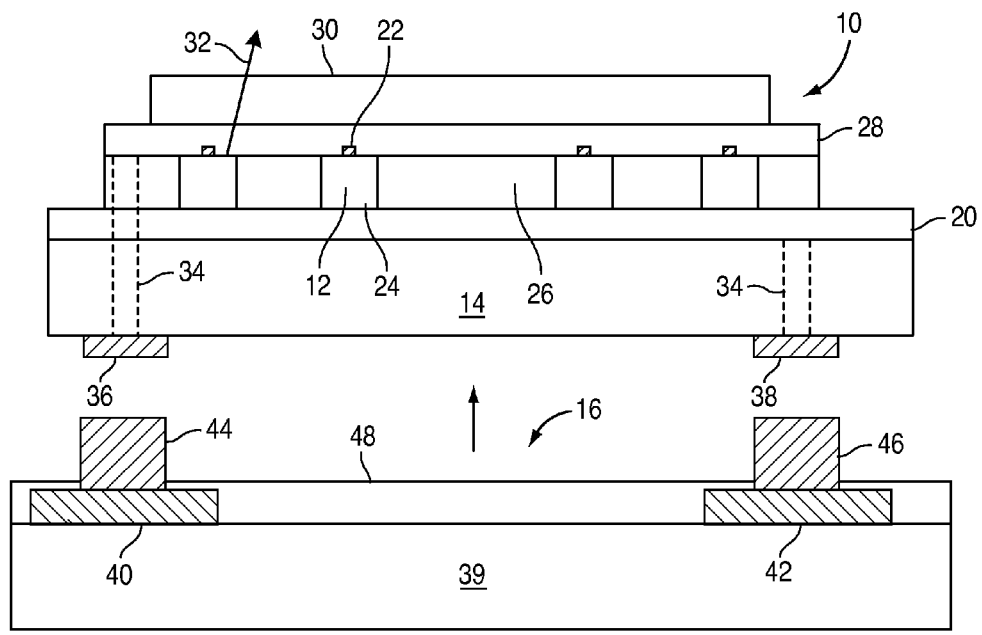
FIG. 1 is a cross-section of an LED light sheet segment and a conductor backplane being brought together. The backplane portion shown is part of a much larger backplane and the segment shown may be on the same dielectric substrate as an array of electrically isolated segments.

FIG. 1 is a cross-section of a single light sheet segment 10 containing at least the four LEDs 12 shown. The segment 10 can be any size. Typically, to form the segments 10, a much larger light sheet is formed and then die cut to form the individual identical segments 10. Since a minimum practical die cut segment is about 2 mm per side, the minimum size segment 10 may be 4 mm$^2$. Such a small size may be used for an addressable display. Even though the LEDs are printed as an ink and are randomly located, the density of the LEDs in the ink can be made so that it is virtually assured that a plurality of LEDs will be located within each segment 10, such as an average of at least five LEDs. The LEDs may be printed in pre-defined areas down to about 1 mm$^2$ using screen printing, flexography, or other types of printing methods. For normal lighting applications, a single segment 10 will be much larger, such as up to 1 or 2 feet per side, depending on the current requirements, and contain hundreds of microscopic LEDs.

In another embodiment, multiple segments are formed on a single dielectric substrate 14 and the segments are not singulated. In such a case, the segments are pre-aligned with respect to each other on the substrate 14 by the printing process but electrically isolated from each other on the substrate 14. Their interconnections and/or connections to a power supply will be determined by a metal pattern on a separate backplane 16 that is laminated to the segments. Laminating a plurality of segments on a single substrate 14 to the backplane 16 eases handling and alignment compared to separately laminating singulated segments 10 to the common backplane 16. In such a case, the segment's LED/conductive layers would be identically repeated as an array on the substrate 14 of FIG. 1, with a gap between each segment for electrically isolating them, and the segments would remain on the same substrate 14 when laminated to the backplane 16. The invention applies equally to electrically isolated segments supported on the same substrate 14 and to singulated segments. The same backplane 16 supports any number of segments 10.

The LED light sheet segment 10 may be formed as follows.

A starting substrate 14 may be polycarbonate, PET (polyester), PMMA, Mylar, other type of polymer sheet, or other material. In one embodiment, the substrate 14 is about 12-250 microns thick and may include a release film.

A conductor layer 20 is then deposited over the substrate 14, such as by printing. The substrate 14 or conductor layer 20 may be reflective. For enhancing flexibility, the conductor layer 20 may be a sintered silver nano-wire mesh.

A monolayer of microscopic inorganic LEDs 12 is then printed over the conductor layer 20. The LEDs 12 are vertical LEDs and include standard semiconductor GaN layers, including an n-layer, and active layer, and a p-layer. GaN LEDs typically emit blue light. The LEDs 12, however, may be any type of LED, based on other semiconductors and/or emitting red, green, yellow, or other color light, including light outside the visible spectrum, such as the ultraviolet or infrared regions.

The GaN-based micro-LEDs 12 are less than a third the diameter of a human hair and less than a tenth as high, rendering them essentially invisible to the naked eye when the LEDs 12 are spread across the substrate 14 to be illuminated. This attribute permits construction of a nearly or partially transparent light-generating layer made with micro-LEDs. In one embodiment, the LEDs 12 have a diameter less than 50 microns and a height less than 20 microns. The number of micro-LED devices per unit area may be freely adjusted when applying the micro-LEDs to the substrate 14. The LEDs 12 may be printed as an ink using screen printing or other forms of printing. Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

In one embodiment, an LED wafer, containing many thousands of vertical LEDs, is fabricated so that the top metal electrode 22 for each LED 12 is small to allow light to exit the top surface of the LEDs 12. The bottom metal electrode 24 is reflective (a mirror) and should have a reflectivity of over 90% for visible light. In the example, the anode electrode is on top and the cathode electrode is on the bottom.

The LEDs 12 are completely formed on the wafer, including the anode and cathode metallizations, by using one or more carrier wafers during the processing and removing the growth substrate to gain access to both LED surfaces for metallization. The LED wafer is bonded to the carrier wafer using a dissolvable bonding adhesive. After the LEDs 12 are formed on the wafer, trenches are photolithographically defined and etched in the front surface of the wafer around each LED, to a depth equal to the bottom electrode, so that each LED 12 has a diameter of less than 50 microns and a thickness of about 4-20 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are singulated. The LEDs 12 of FIG. 1 result. The microscopic LEDs 12 are then uniformly infused in a solvent, including a viscosity-modifying polymer resin, to form an LED ink for printing, such as screen printing or flexographic printing.

The LED ink is then printed over the conductor layer 20. The orientation of the LEDs 12 can be controlled by providing a relatively tall top electrode 22 (e.g., the anode electrode), so that the top electrode 22 orients upward by taking the fluid path of least resistance through the solvent after printing. By providing a heavier bottom electrode 24, the LEDs 12 also self-orient. The anode and cathode surfaces may be opposite to those shown. The locations of the LEDs 12 are random, but the approximate number of LEDs 12 printed per unit area can be controlled by the density of LEDs 12 in the ink. The LED ink is heated (cured) to evaporate the solvent. After curing, the LEDs 12 remain attached to the underlying conductor layer 20 with a small amount of residual resin that was dissolved in the LED ink as a viscosity modifier. The adhesive properties of the resin and the decrease in volume of resin underneath the LEDs 12 during curing press the bottom cathode electrode 24 against the underlying conductor layer 20, creating a good electrical connection. Over 90% like orientation has been achieved, although satisfactory performance may be achieved with only 50% of the LEDs being in the desired orientation for a DC driven lamp design. 50% up and 50% down is optimal for lamps that are powered with AC.

A transparent polymer dielectric layer 26 is then selectively printed over the conductor layer 20 to encapsulate the sides of the LEDs 12 and further secure them in position. The ink used to form the dielectric layer 26 pulls back from the upper surface of the LEDs 12, or de-wets from the top of the LEDs 12, during curing to expose the top electrodes 22. If any dielectric remains over the LEDs 12, a blanket etch step may be performed to expose the top electrodes 22.

To produce a lamp that emits upward and away from the substrate 14, conductor layer 28 may be a transparent conductor, such as ITO or sintered silver nano-wires forming a mesh, which is printed to contact the top electrodes 22. The conductor layer 28 is cured by lamps to create good electrical contact to the electrodes 22.

The LEDs 12 in the monolayer, within each segment 10, are connected in parallel by the conductor layers 20/28 since the LEDs 12 have the same orientation. Since the LEDs 12 are connected in parallel, the driving voltage will be approximately equal to the voltage drop of a single LED 12.

A flexible, transparent, polymer protective layer 30 may be printed over the transparent conductor layer 28. The layer 30 may instead represent a phosphor layer for wavelength-conversion of the LED light. In one embodiment, the LEDs 12 emit blue light and the phosphor is a YAG phosphor emitting yellow-green light so that the composite light is white.

When the LEDs 12 are energized by a voltage potential across the conductor layers 20/28, very small and bright blue dots are visible. A blue light ray 32 is shown.

If the terminals of the segment 10 are to be on the bottom of the substrate 14, conductive vias 34 may be formed by coating a hole with a conductive material. The vias 34 terminate in metal terminals 36 and 38, electrically coupled to the conductor layers 28 and 20, respectively.

The backplane 16 uses a substrate 39 that may be the same dielectric material as the substrate 14, or any other flexible material, and may also be 12-250 microns thick. The backplane 16 substrate 39 may instead be a rigid material of any thickness. The backplane 16 can be any size, which will typically be the size of the resulting lamp, including a 2×4 foot lamp to replace conventional fluorescent troffers. Any number of segments 10 may be mounted on the same backplane 16.

A metal pattern is formed on the backplane substrate 39 for connecting the segment terminals 36/38 to a power source. The metal pattern may interconnect the segments 10 in any manner or connect each segment separately to a row/column addressing circuit to form an addressable display.

Cross-sections of metal strips 40 and 42 are shown in the example of FIG. 1. The metal may be aluminum, copper, silver, solder, or any other metal or alloy. The metal may be plated, sputtered, printed, laminated foil, etched, lifted off, or formed in any other manner. The thickness and widths of the metal strips 40 and 42 are that required to handle the operating current without significant voltage drop across the lamp.

Metal bumps 44 and 46 are formed on the metal strips 40 and 42 at locations corresponding to the segment 10 terminals to be contacted.

A dielectric adhesive layer 48 is deposited over the surface of the backplane 16 and is of a thickness to allow the bumps 44 and 46 to extend above the adhesive layer. In one example, the bumps 44 and 46 are about 50 microns high and the adhesive layer 48 is about 25 microns thick, so the bumps 44/46 extend about 25 microns above the adhesive layer 48. The adhesive layer may be blanket deposited or deposited using a mask. The adhesive pulls off the bumps by surface tension. The adhesive may be UV or thermally cured or be a pressure sensitive adhesive with a suitable bonding strength.

Figure 2:
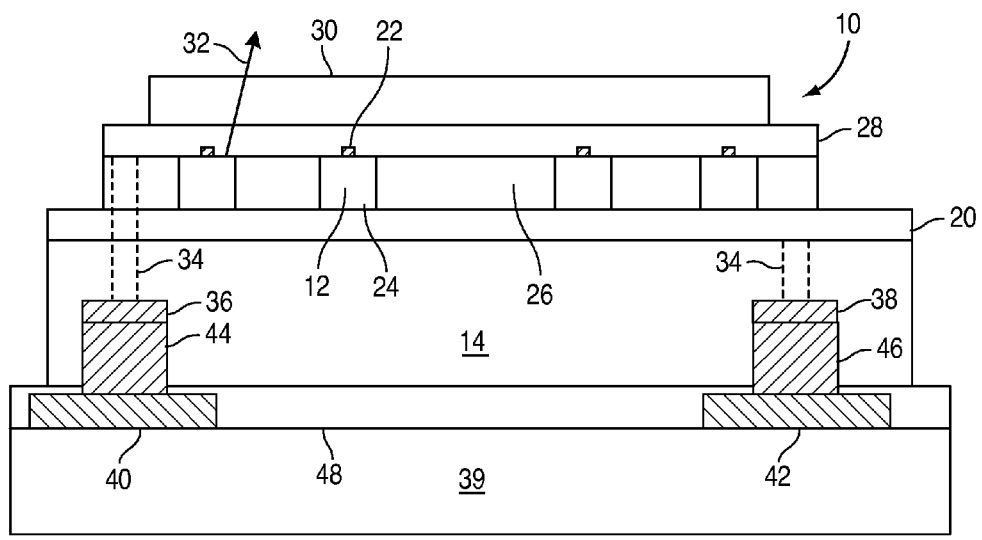
FIG. 2 illustrates the light sheet segment and backplane after being pressed together.

FIG. 2 illustrates the resulting structure after the segment 10 and backplane 16 have been pressed together to laminate the two layers, such as in a roll-to-roll process. The cured adhesive is flexible so that the resulting lamp may be bent without delamination.

In one embodiment, the substrate 14 is resilient so the metal bumps 44 and 46 extend into the substrate 14 somewhat to make a very good electrical contact with the segment terminals 36 and 38, where the adhesive layer 48 essentially encapsulates the electrical connections.

The metal bumps 44 and 46 may be any metal, such as a printed or otherwise deposited silver, nickel, zinc, carbon, copper, aluminum, etc. If printed as an ink, the metal ink is cured, such as with UV or heat. In another embodiment, the metal bumps 44 and 46 are formed of a solder, and the structure is heated to flow the solder. The bumps 44 and 46 may also be a conductive epoxy.

Figure 3:
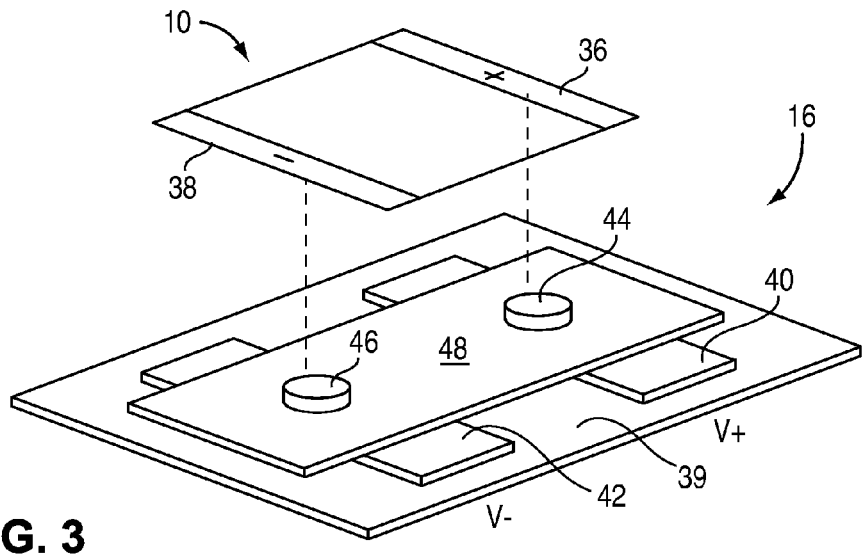
FIG. 3 is a simplified perspective view of a light sheet segment being aligned with electrodes (raised bumps) on the backplane.

FIG. 3 illustrates the segment 10 terminals 36/38 being aligned with the bumps 44/46 prior to lamination. As previously mentioned, the segments need not be singulated but may all be supported on the same substrate 14 and electrically isolated prior to being mounted on the backplane 16.

Figure 4:
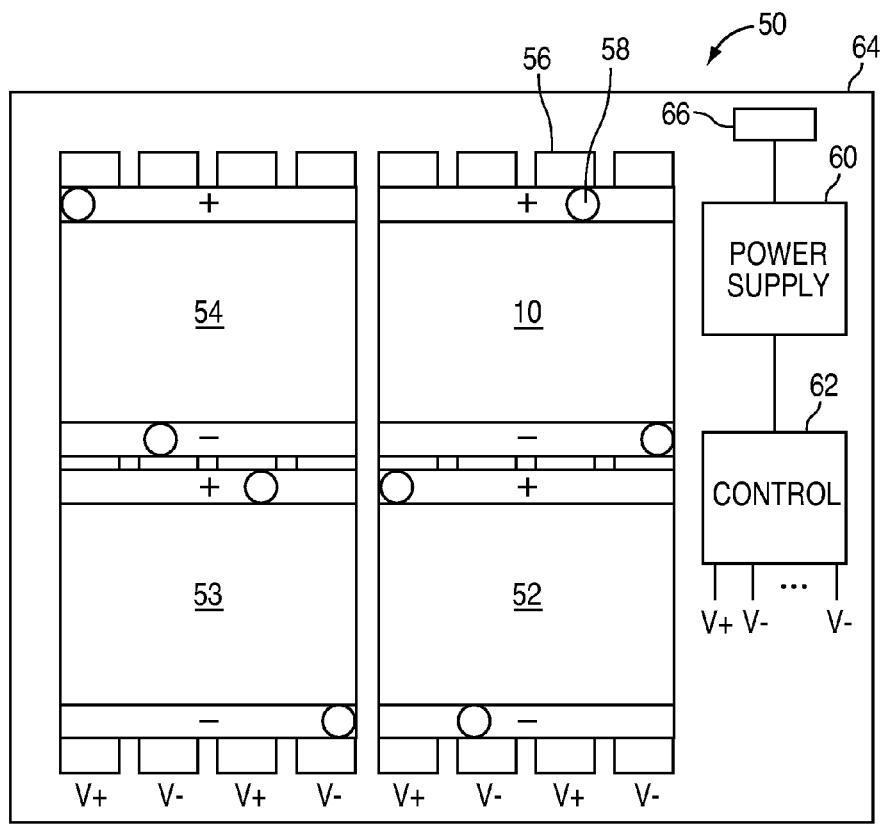
FIG. 4 is a top down view of a section of a possibly much larger lamp, showing four segments mounted over strips of metal conductors on the backplane, where addressable channels are formed using multiple columns of metal strips.

FIG. 4 illustrates one type of metal pattern on a backplane 50. In the example, four segments 10, 52, 53, and 54 are shown laminated to the backplane. The anode and cathode terminals of the segments are labeled + and −, respectively. The metal pattern forms metal column strips 56, and the metal bumps 58 are located to contact the desired terminals of the segments. In the example, there are eight strips 56, where each segment is electrically connected to two of the strips 56. This allows each of the four segments to be individually driven by a power supply 60 and a controller 62. There may be many more segments connected to the various strips 56 so that multiple segments are connected in parallel, and all segments in parallel may be addressed by energizing a pair of column strips 56. The selective control of the segments may control the brightness of the lamp, create a display, change the overall output color of the lamp if the segments contain different colors of LEDs or phosphors, or achieve other functions.

The power supply 60 and controller 62 may be formed on the backplane substrate 64 and have a connector 66 for receiving 120 VAC and digital control signals for selectively energizing the strips 56.

By interconnecting the segments and/or driving the segments via the robust metal pattern on the backplane 50, large currents may be carried with little voltage drop. The thin conductive layers in the segments can have fairly high sheet resistances without a significant voltage drop since the conductive layers need only conduct the current for the LEDs in that segment. Therefore, the ITO layer or silver nano-wire mesh can be thin and transparent, improving efficiency. Additionally, identical segments can be produced, and the electrical interconnections can be customized on the various backplanes for different applications.

The entire lamp thickness may be less than 0.5 mm and the lamp can be very flexible.

In another embodiment, the metal pattern on the backplane may connect all segments in parallel using, for example, a serpentine pattern of two metal strips under each segment where one strip is connected to the anode terminal and the other strip is connected to the cathode terminal of each segment. Any number of segments may be mounted on the backplane.

Figure 5:
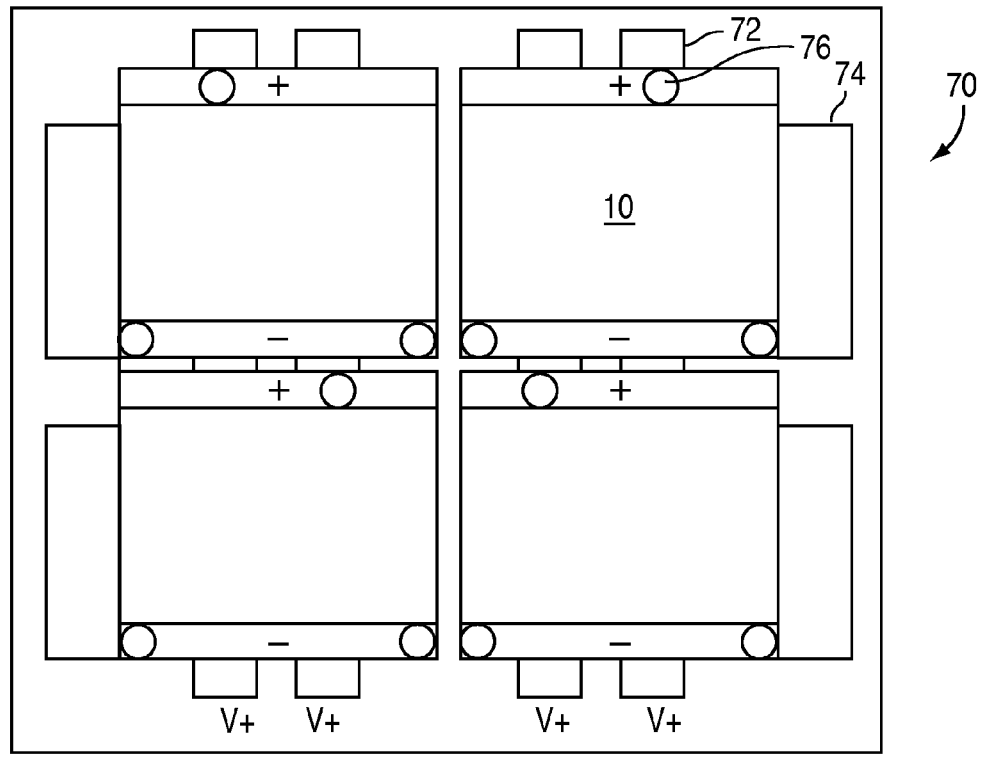
FIG. 5 illustrates an addressable system of segments using row and column strips on the backplane, where row strips contact cathode terminals and column strips contact anode terminals.

FIG. 5 illustrates another backplane 70 metal pattern where metal column strips 72 and metal row strips 74 contact the terminals of four segments via the metal bumps 76. Any of the four segments can be energized by applying a driving voltage across a combination of a row strip and a column strip. A much larger array of segments and strips can be used to create an addressable display of any size. The segments may be as small as 4 mm$^2$ or be 100 cm$^2$ or larger.

Figure 6:
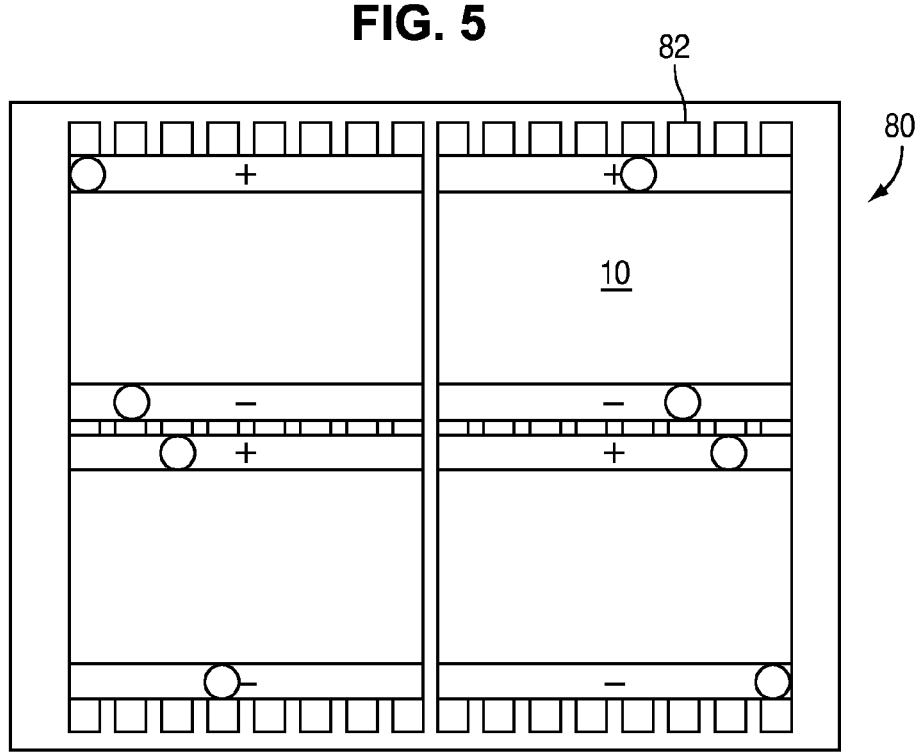
FIG. 6 illustrates an addressable system with column strips for higher resolution addressing compared to FIG. 4.

FIG. 6 illustrates a portion of a backplane 80 with 16 metal column strips 82 for selectively energizing two columns of segments with four segments per column. The metal bumps are illustrated by the small circles in the various figures.

Figure 7:
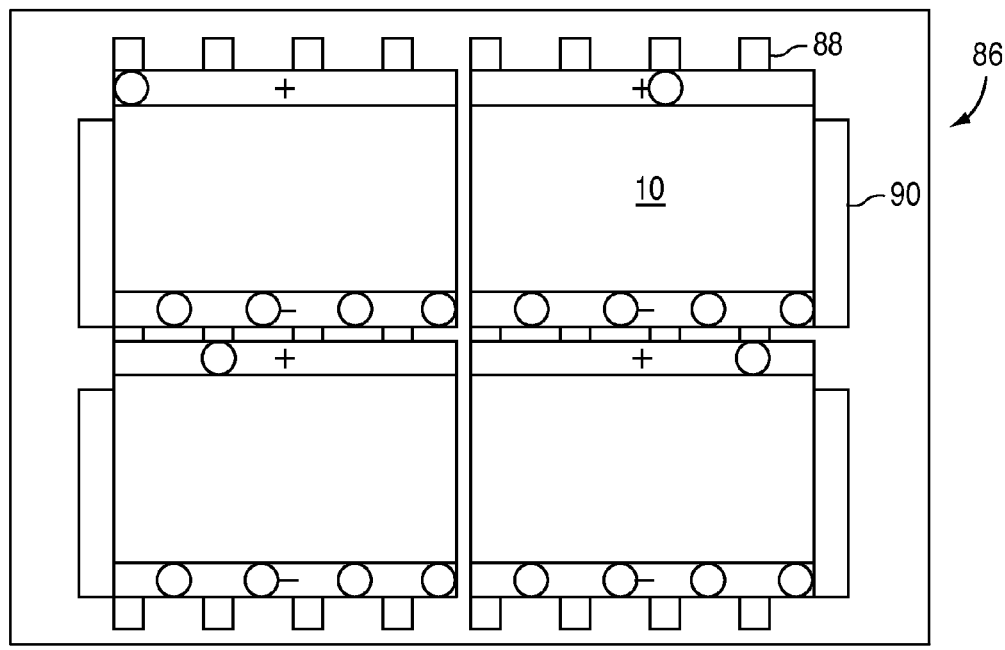
FIG. 7 illustrates an addressable system with row and column strips with higher resolution compared to FIG. 5.

FIG. 7 illustrates a portion of a backplane 86 with column strips 88 and row strips 90, where four segments per column can be individually addressed by energizing combinations of column and row strips.

Figure 8:
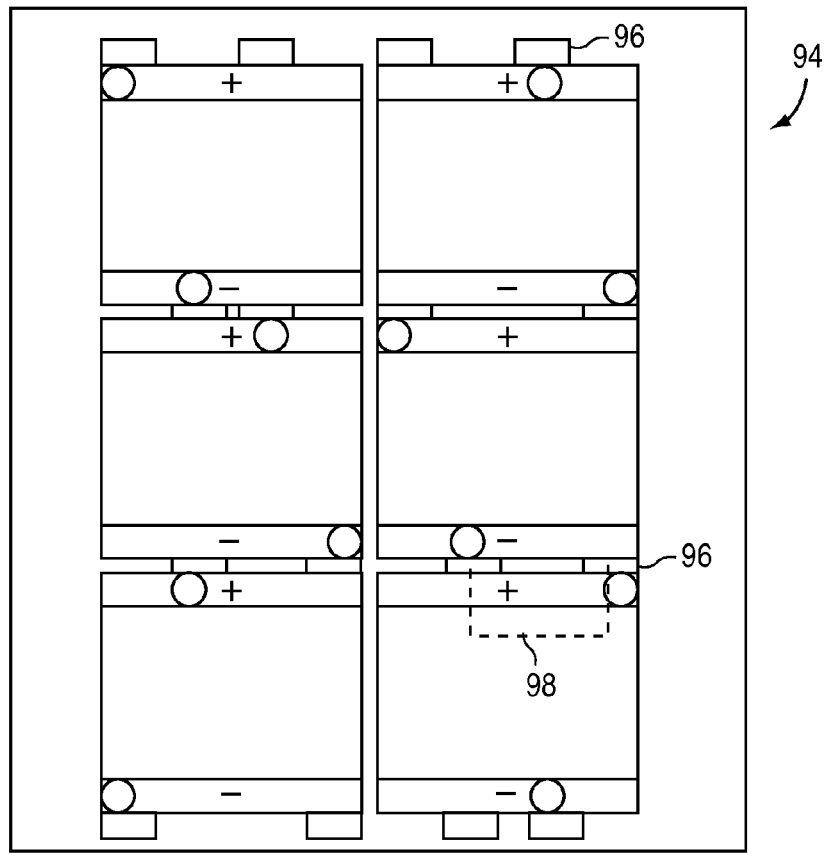
FIG. 8 illustrates how any number of segments may be connected in series. A series string may be addressable or connected in parallel with other series strings.

FIG. 8 illustrates a backplane 94 having isolated metal areas 96 that connect segments in series. The dashed line 98 represents how a pair of metal areas 96 are connected together on the backplane 94 below the segments. The columns of segments (connected in series) may be connected in parallel, or the columns may be connected in series.

Figure 9:
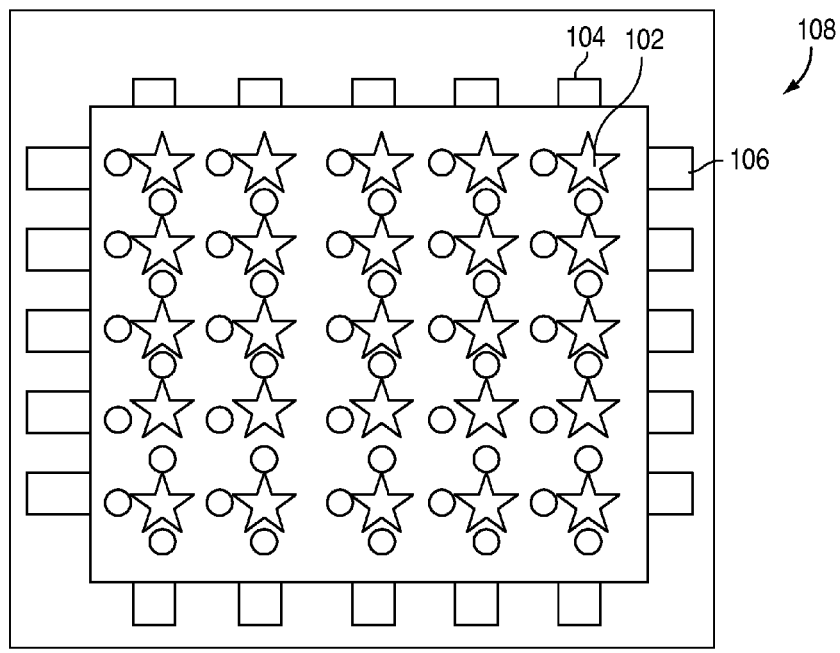
FIG. 9 illustrates how a shaped pixel (a star, circle, square, etc.) can be individually addressed using row and column strips on the backplane.

FIG. 9 illustrates how each segment 102 may form a star or any other shape, such as an alpha-numeric character, a square, a circle, etc. Each segment 102 is connected to a unique combination of a column strip 104 and a row strip 106 on the backplane 108 so each segment can be individually addressable using a controller, such as shown in FIG. 4. Each segment 102 may form a pixel in a display or form a separate character, such as a letter or number. Multiple segment colors may be used to form a full color display.

Figure 10:
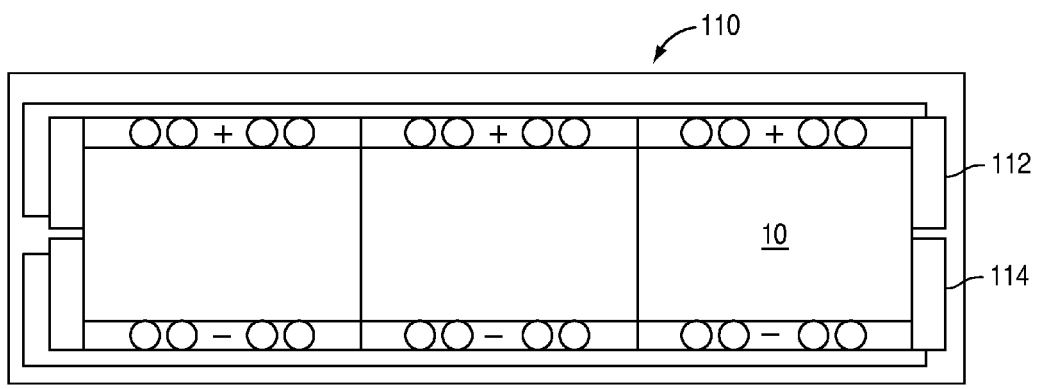
FIG. 10 illustrates how a linear array of segments may be connected in parallel or series to form a narrow light sheet of any length. Any other shape can be fabricated.

FIG. 10 illustrates how the backplane 110 contains two row strips 112 and 114 to form a narrow and long backplane 110 for connecting any number of segments 10 in parallel in a linear array. The backplane 110 can be cut to any length. A connector, such as a plug or socket, may be affixed to the end of the backplane 110 for connection to a power source.

Figure 11:
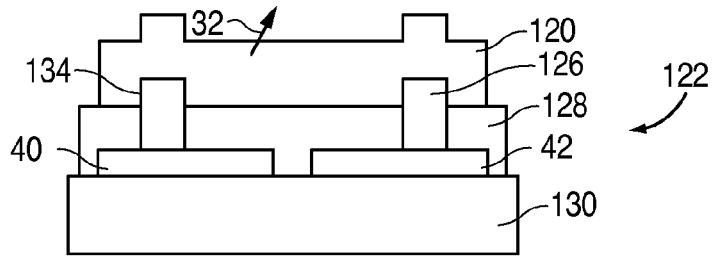
FIG. 11 is a schematic cross-section of a simple light sheet segment mounted on a single-layer backplane, where one backplane electrode contacts the anode terminal of the segment along one edge, and the other backplane electrode contacts the cathode terminal of the segment along the other edge. The bumps on the backplane are shown distorting the top surface of the thin light sheet segment. The segment may be on the same dielectric substrate with an array of segments, or the segment may be physically separate.

FIG. 11 is a schematic cross-section of a simple light sheet segment 120 mounted on a single-metal-layer backplane 122, where one backplane electrode bump 134 contacts the anode terminal of the segment 120 along one edge, and the other backplane electrode bump 126 contacts the cathode terminal of the segment 120 along the other edge. The bumps 124/126 on the backplane 122 are shown distorting the top surface of thin light sheet segment 120. The metal strips 40/42 may be parallel column strips. The adhesive layer 128 and backplane substrate 130 are also shown.

Figure 12:
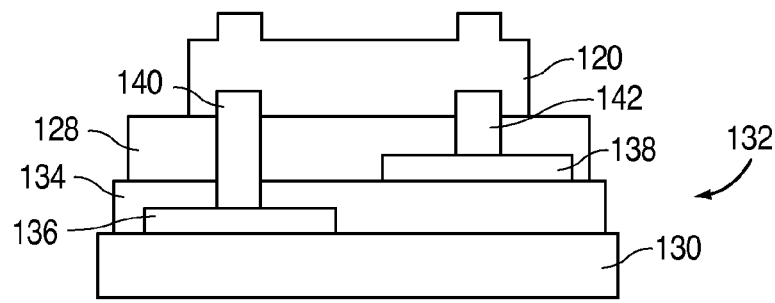
FIG. 12 illustrates the use of multiple conductor layers on the backplane, such as for row and column strips.

FIG. 12 illustrates the use of multiple conductor layers on the backplane 132, such as for overlapping row and column strips. A dielectric layer 134 insulates the metal strip 136 from the overlying metal strip 138 where they overlap. The bumps 140/142 contact the segment 120 terminals.

Figure 13:
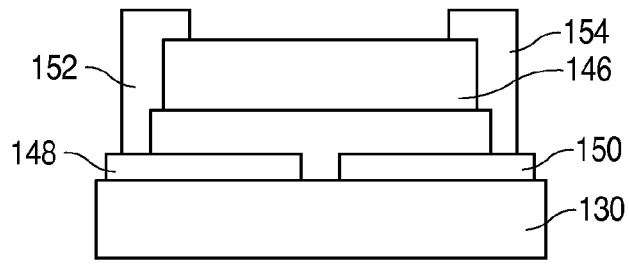
FIG. 13 illustrates how the anode and cathode terminals on the light sheet segment may be on the top light exit surface, where connections between the backplane conductors and the segment terminals are made by conductors that wrap around the edges of the segment. Conductive vias through the segment can also be used.

FIG. 13 illustrates how the anode and cathode terminals on the light sheet segment 146 may be on the top light exit surface, where connections between the backplane metal strips 148/150 (or areas) and the segment 146 terminals are made by conductors 152/154 (straps) that wrap around the edges of the segment 146. Conductive vias through the segment 146 can also be used. Other types of conductors are envisioned.

Figure 14:
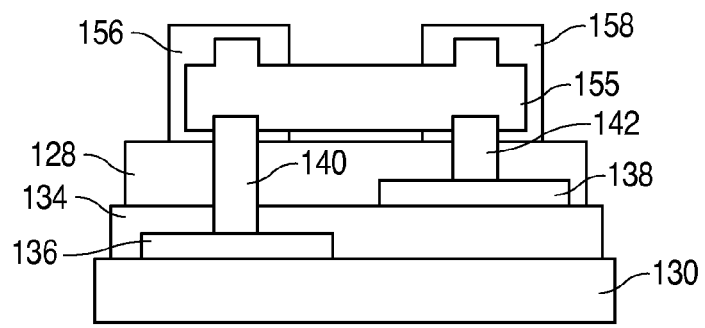
FIG. 14 illustrates an alternative design for a front-to-front electrical connection between the segment terminals and the backplane electrodes.

FIG. 14 illustrates an alternative design for a front-to-front electrical connection between the segment 155 top terminals and the backplane electrode bumps 140/142. In this embodiment, conductors 156/158 wrap around the edges of the segment 155 to make the connection.

Figure 15:
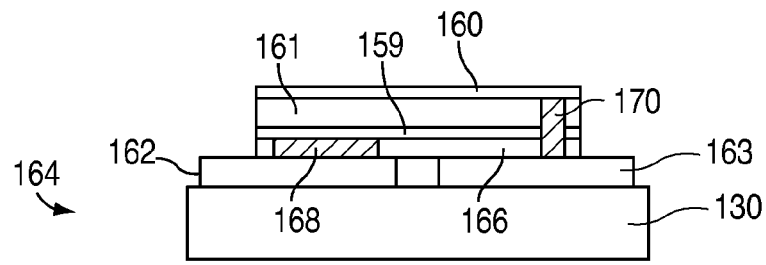
FIG. 15 illustrates how the LED/conductive layers can be printed directly on the metal strips of the backplane so no separate substrate of the segment is needed.

FIG. 15 illustrates how the conductive layers 159/160 and LED layer 161 (forming a segment) can be printed over the metal strips 162/163 of the backplane 164 so no separate substrate of the LED/conductive layers is needed. The top conductive layer 160 is transparent. A dielectric layer 166 is formed over and between the metal strips 162/163, followed by printing the LED/conductor layers. Conductive vias 168/170 are formed to connect the metal strips 162/163 to the conductive layers 159/160. All of the segments can be printed simultaneously over the same backplane 164.

Figure 16:
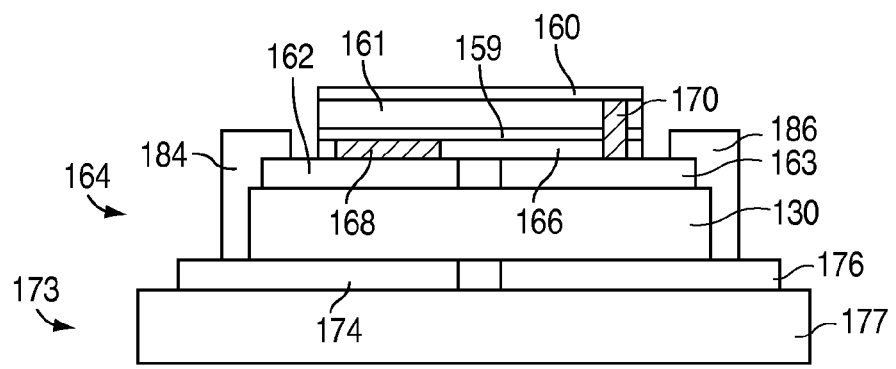
FIG. 16 illustrates the use of multiple backplanes being stacked so the metal strips on the backplanes are connected in parallel to conduct any amount of current with insignificant voltage drops.

FIG. 16 illustrates the use of multiple backplanes 164/173 being stacked so the metal strips on the backplanes are connected in parallel to conduct any amount of current with insignificant voltage drops. Metal strips 174 and 176 are formed on the backplane substrate 177, and metal strips 162 and 163 are formed on the backplane substrate 130. The metal strips 174 and 162 are connected together via the side conductor 184, and the metal strips 176 and 163 are connected together via the side conductor 186. Additional backplanes can be stacked to conduct higher currents, depending on the size of the lamp. The ends of the four metal strips are connected to a power source. The LED/conductive layers may be printed over the top backplane 164 as in FIG. 15, or the segment 10 of FIG. 1 may be mounted to the top backplane 164.

As in all embodiments, the backplane may be the approximate size of the entire lamp and connects all the segments to a power source. The backplane may interconnect multiple light sheet segments together or create an individually addressable display. Also, in all embodiments, an array of segments may be supported by the single substrate 14 of FIG. 1 or the segments can be singulated prior to being mounted on the backplane.

Figure 17:
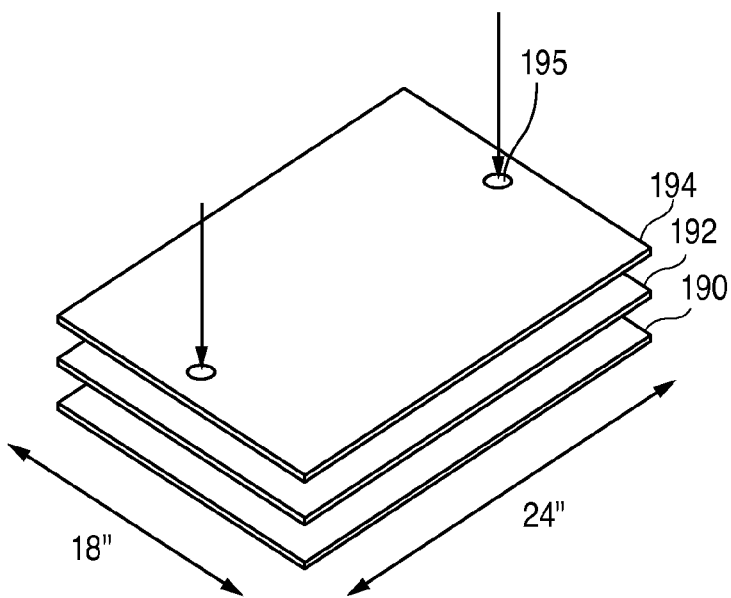
FIG. 17 is a perspective view illustrating how the backplane sheet can be aligned with the segments using mechanical alignment or optical alignment.

FIG. 17 is a perspective view illustrating how the backplane substrate 190, having an adhesive layer 192, can be aligned with an LED light sheet 194, having one or more segments, using mechanical alignment or optical alignment. In the example shown, holes 195 are precisely located in the light sheet 194 that align with holes through, or marks on, the backplane, followed by a lamination step. Mechanical or optical means may be used for the alignment. Since the light sheet 194 may be transparent, alignment marks can be printed on the light sheet 194 instead of holes, and the alignment marks are aligned with alignment marks on the backplane. In the example shown, the lamp is 18×24 inches, and the light sheet 194 may contain any number of segments, such as over 1000, that are interconnected and/or coupled to a power source via the metal strips (or metal areas) on the backplane substrate 190.

Since the LED light sheet and backplane may be a fraction of a millimeter thick, they are highly flexible and light. As such, the lamination process may be performed in a roll-to-roll process. Since the LED light sheet and the backplane metal pattern can be formed by printing, they can also be formed in a roll-to-roll process.

Figure 18:
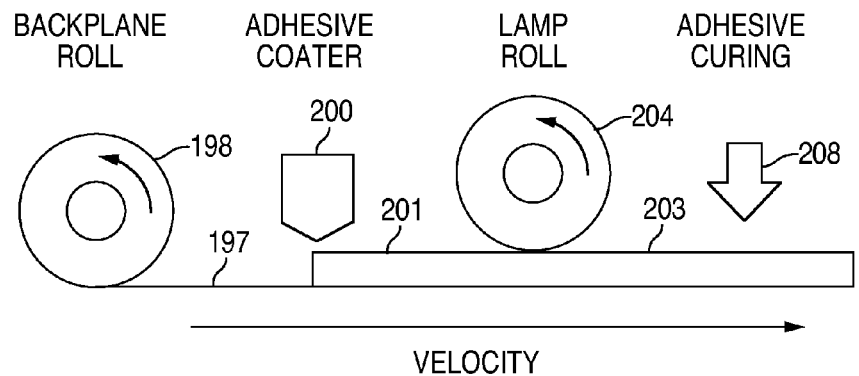
FIG. 18 illustrates how a roll-to-roll process can be used for the adhesive deposition, the lamination of the segments to the backplane, and the curing of the adhesive.

FIG. 18 illustrates how a roll-to-roll process can be used for the adhesive deposition, the lamination of the segments to the backplane, and the curing of the adhesive. The backplane substrate 197 with the metal pattern is provided on a roll 198. An adhesive coater 200 applies a thin coat of an adhesive 201 over the metal pattern, while allowing the metal bumps (e.g., bumps 44/46 in FIG. 1) to extend above the adhesive layer. Electrically isolated light sheet segments 203 on a common substrate (e.g., substrate 14 of FIG. 1) are provided on a lamp roll 204, and the segments 203 are laminated to the backplane under pressure to make the electrical connections between the segments 203 and the metal pattern (shown in FIGS. 1-3). The adhesive 201 is then cured at a curing station 208, such as by heat or UV (since the segments may be semi-transparent). The resulting laminated lamp may be then taken up by a take-up roller or cut to form the individual lamps and stacked as sheets. Power supplies and controllers (if needed) may be mounted on the backplane and connected to the metal strips.

Figure 19:
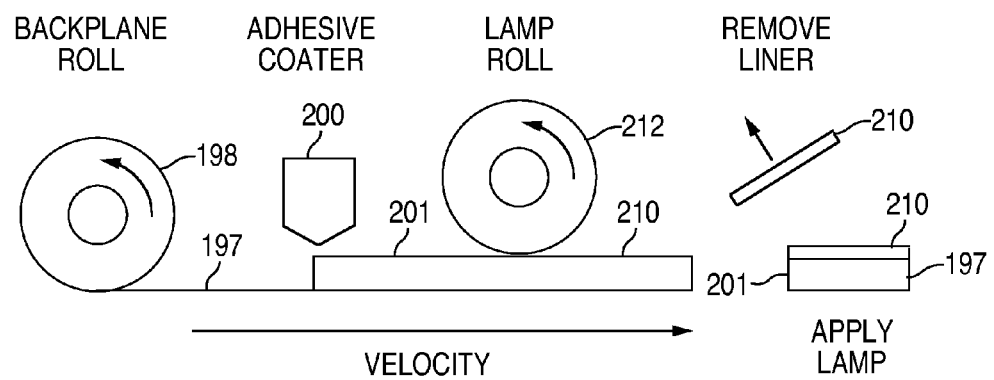
FIG. 19 illustrates how the backplane is separately formed to have an adhesive layer and a protective liner film over the adhesive so the backplane can be stored on a roll. Later, the backplane roll is provided in a roll-to-roll process where the liner is removed and the segments are laminated onto the backplane, as shown in FIG. 18.

FIG. 19 illustrates how the backplane is separately formed to have an adhesive layer and a protective liner film over the adhesive so the backplane can be stored on a roll. The backplane substrate 197 the metal pattern is provided on a roll 198, and an adhesive coater 200 applies a thin coat of an adhesive 201 over the metal pattern, as described above. A thin liner sheet 210 is provided on a liner roll 212 and protects the uncured adhesive 201 as the resulting backplane is taken up by a take-up roller (not shown) for later use. When the backplane is to be laminated to the segments, as shown in FIG. 18, the liner sheet 210 is peeled off during the roll-to-roll process, and the segments are laminated onto the backplane, as shown in FIG. 18.

The manufacturing cost of the resulting lamp is reduced since the backplane metal can be any conventional metal formed using any process rather than a metal optimized for use in the light sheet segment whose formation must be compatible with the segment fabrication process. Further, since the segments may be identical, only the backplane needs to be customized for a particular application.

Since the resulting lamp is very thin and flexible, a semi-rigid frame may be used to support the lamp, such as for a ceiling fixture or for a vertical display. Alternately, the thin lamp may be directly affixed to any flat or curved surface. Baseboard, wall, under-shelf, and other types of lighting applications are also envisioned.

All features described herein may be combined in various combinations to achieve a desired function.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination structure comprising:
    a plurality of electrically isolated light-emitting segments, each segment comprising:
        a first conductive layer;
        a plurality of inorganic light emitting diodes (LEDs) having a first electrode electrically contacting the first conductive layer;
        a transparent second conductive layer overlying the LEDs and electrically contacting a second electrode of the LEDs to connect the LEDs in parallel;
        a first terminal in electrical contact with the first conductive layer; and
        a second terminal in electrical contact with the second conductive layer,
        wherein each segment forms a sheet having edges;
    a conductive backplane fabricated separately from the segments, the backplane comprising:
        a dielectric backplane substrate; and a metal pattern formed over the backplane substrate, the metal pattern comprising electrodes that align with the first terminal and the second terminal of each of the segments, wherein the plurality of segments is laminated over the backplane substrate and the metal pattern such that the first terminal and the second terminal of each of the segments electrically contacts associated electrodes of the metal pattern, wherein the metal pattern supplies power to the segments, and wherein the segments are laterally spaced on the substrate, and wherein edges of adjacent segments are aligned with each other to create an array of the segments.

2. The structure of claim 1 wherein the segments are formed on a common segment substrate.

3. The structure of claim 1 wherein the segments are physically separated from one another.

4. The structure of claim 1 wherein the metal pattern connects at least some of the segments in series.

5. The structure of claim 1 wherein the metal pattern connects at least some of the segments in parallel.

6. The structure of claim 1 wherein the metal pattern comprises row strips and column strips such that a single segment can be selectively energized by applying a voltage between a row strip and a column strip.

7. The structure of claim 1 wherein the metal pattern comprises column strips such that one or more selected segments can be energized by applying a voltage between at least two of the column strips.

8. The structure of claim 1 wherein the segments mounted over the metal pattern form a lamp for general lighting.

9. The structure of claim 1 wherein the segments mounted over the metal pattern form an addressable display.

10. The structure of claim 1 wherein the segments and backplane are flexible.

11. The structure of claim 1 where in the segments further comprise a segment substrate, wherein conductive vias are formed through the segment substrate to make electrical connections between the first conductive layer and the first terminal and between the second conductive layer and the second terminal.

12. The structure of claim 1 where in the segments further comprise a segment substrate, wherein conductors are formed around edges of the segment substrate to make electrical connections between the first conductive layer and the first terminal and between the second conductive layer and the second terminal.

13. The structure of claim 1 further comprising an adhesive layer over the backplane substrate that is affixed to a bottom surface of the segments.

14. The structure of claim 13 wherein the metal pattern electrodes form bumps that extend above the adhesive layer.

15. The structure of claim 1 further comprising a power supply mounted on the backplane substrate for supplying power to the metal pattern.

16. The structure of claim 1 wherein the metal pattern comprises at least two levels of metal layers.

17. The structure of claim 1 wherein the LEDs are vertical LEDs.

18. The structure of claim 1 wherein the LEDs are printed over the first conductive layer.

19. The structure of claim 1 wherein all the segments emit the same color of light.

20. The structure of claim 1 wherein the segments emit a variety of colors of light.

* * * * *